(12) United States Patent
Ufert

(10) Patent No.: US 7,881,092 B2
(45) Date of Patent: Feb. 1, 2011

(54) INCREASED SWITCHING CYCLE RESISTIVE MEMORY ELEMENT

(75) Inventor: Klaus Ufert, Unterschleissheim (DE)

(73) Assignee: Rising Silicon, Inc., Austin, TX (US)

( * ) Notice: Subject to any disclaimer, the term of this patent is extended or adjusted under 35 U.S.C. 154(b) by 194 days.

(21) Appl. No.: 11/782,525

(22) Filed: Jul. 24, 2007

(65) Prior Publication Data

US 2009/0027944 A1   Jan. 29, 2009

(51) Int. Cl.
*G11C 11/00* (2006.01)

(52) U.S. Cl. .................. 365/148; 365/100; 365/163; 257/2; 257/9; 438/240

(58) Field of Classification Search ............ 365/46, 365/94, 100, 129, 148, 163; 257/2–4, 9, 257/310, E21.35; 438/135, 240, 785
See application file for complete search history.

(56) References Cited

U.S. PATENT DOCUMENTS

| | | | |
|---|---|---|---|
| 3,588,638 | A | 6/1971 | Fleming et al. |
| 2004/0114413 | A1* | 6/2004 | Parkinson et al. ........... 365/100 |
| 2004/0124407 | A1* | 7/2004 | Kozicki et al. ................. 257/9 |
| 2004/0183198 | A1* | 9/2004 | Andrei et al. ............... 257/758 |
| 2005/0274942 | A1* | 12/2005 | Kozicki ........................ 257/9 |
| 2006/0054950 | A1 | 3/2006 | Baek et al. |
| 2006/0108625 | A1* | 5/2006 | Lee et al. .................... 257/310 |
| 2006/0170027 | A1 | 8/2006 | Lee et al. |
| 2006/0263289 | A1 | 11/2006 | Heo et al. |
| 2007/0114508 | A1 | 5/2007 | Herner et al. |
| 2007/0159869 | A1 | 7/2007 | Baek et al. |

FOREIGN PATENT DOCUMENTS

| | | |
|---|---|---|
| DE | 10 2007 001 085 A1 | 7/2007 |
| DE | 10 2006 023 609 A1 | 11/2007 |
| GB | 1363985 | 8/1974 |

OTHER PUBLICATIONS

Gibbons, J.F., et al., "Switching Properties of Thin NiO Films*," Solid-State Electronics, 1964, pp. 785-797, vol. 7, Pergamon Press, Great Britain.

Hiatt, W.R., et al., "Bistable Switching in Niobium Oxide Diodes[1]," Applied Physics Letters, Mar. 15, 1965, pp. 106-108, vol. 6, No. 6, American Institute of Physics, Melville, NY, USA.

(Continued)

*Primary Examiner*—Richard Elms
*Assistant Examiner*—Harry W Byrne
(74) *Attorney, Agent, or Firm*—Marger Johnson & McCollom, P.C.

(57) ABSTRACT

An integrated circuit including a resistive memory element and a method of manufacturing the integrated circuit are described. The method of manufacturing the integrated circuit includes depositing a switching layer material and intentionally forming inhomogeneously distributed defects within the switching layer material to increase a number of switching cycles of the resistive memory element. The resistive memory element includes a switching layer that selectively switches between a low resistance state and a high resistance state. The switching layer contains intentionally formed defects that increase the number of switching cycles of the switching layer.

27 Claims, 5 Drawing Sheets

OTHER PUBLICATIONS

Argall, F., "Switching Phenomena in Titanium Oxide Thin Films," Solid-State Electronics, 1968, pp. 535-541, vol. 11, Pergamon Press, Great Britain.

Steenbeck, K., et al., "The Problem of Reactive Sputtering and Cosputtering of Elemental Targets," Thin Solid Films, 1982, pp. 371-380, vol. 92, Elsevier Sequoia, The Netherlands.

Baek, I.G., et al., "Highly Scalable Non-volatile Resistive Memory using Simple Binary Oxide Driven by Asymmetric Uni-polar Voltage Pulses," International Electron Devices Meeting, 2004, 26 pages, Samsung Electronics Co., Ltd, Korea.

Seo, S., et al., "Reproducible resistance switching in polycrystalline NiO films," Applied Physics Letters, Dec. 6, 2004, pp. 5655-5657 vol. 85, No. 23, American Institute of Physics, Melville, NY, USA.

Seo, S., et al., "Conductivity switching characteristics and reset currents in NiO films," Applied Physics Letters, Feb. 25, 2005, pp. 093509-093509-3, vol. 86, No. 9, American Institute of Physics, Melville, NY, USA.

* cited by examiner

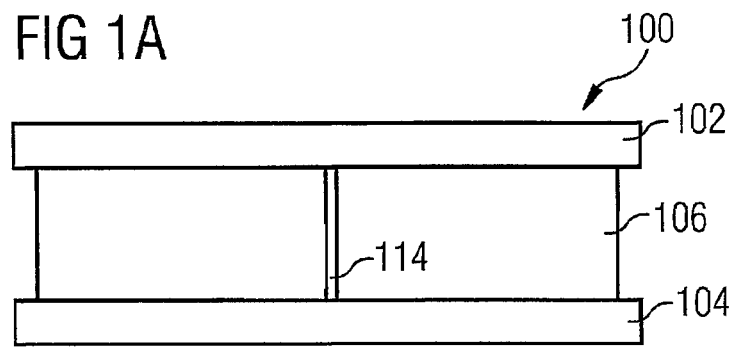
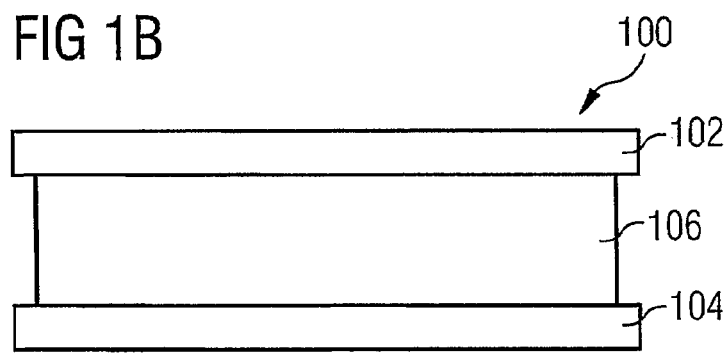
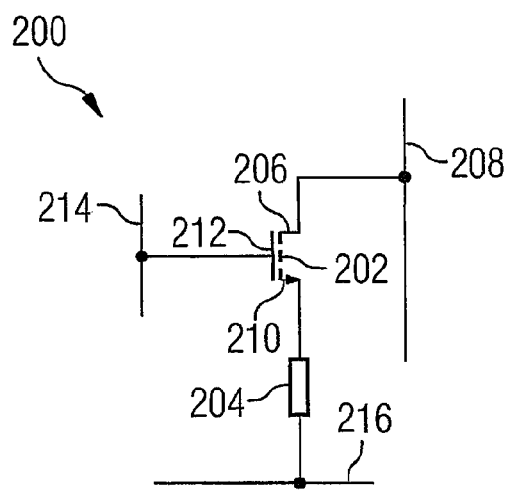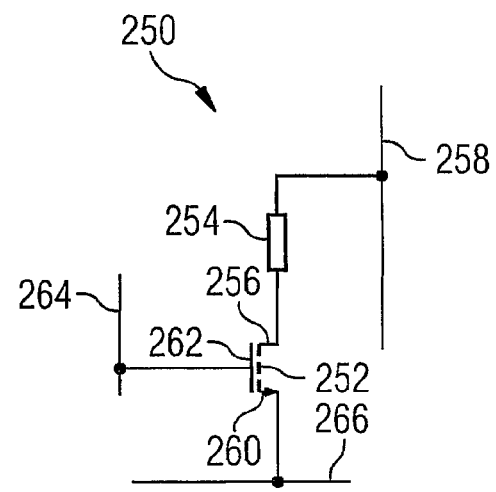

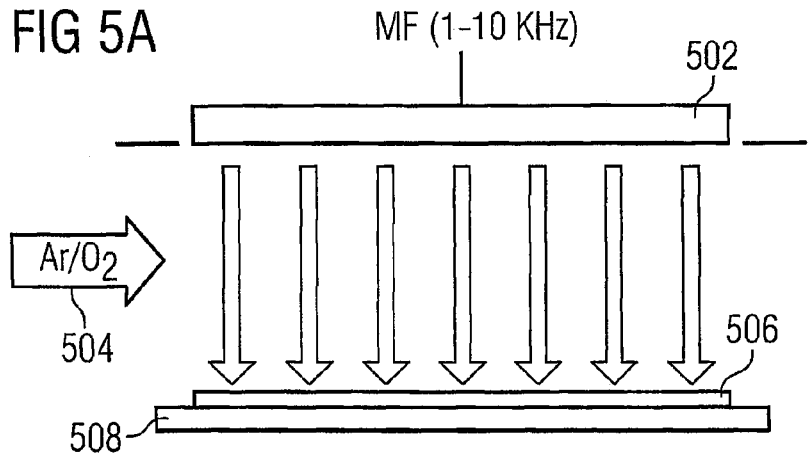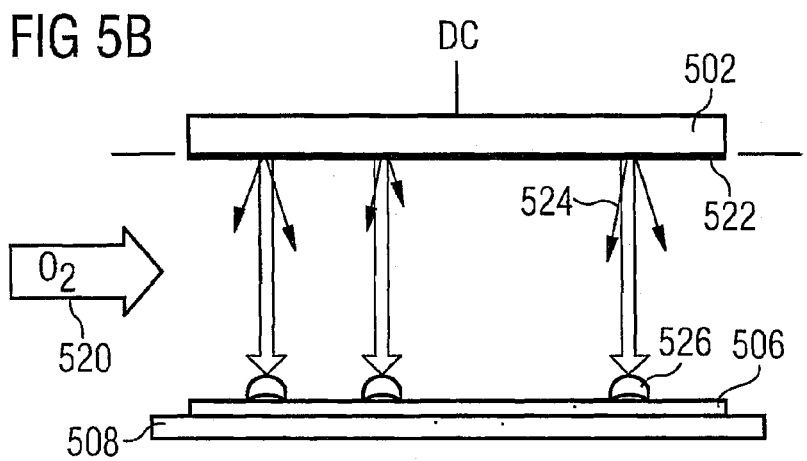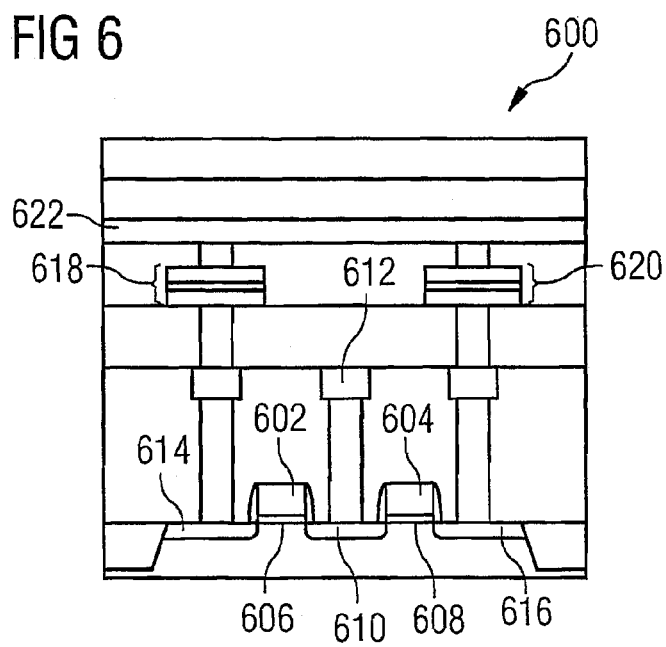

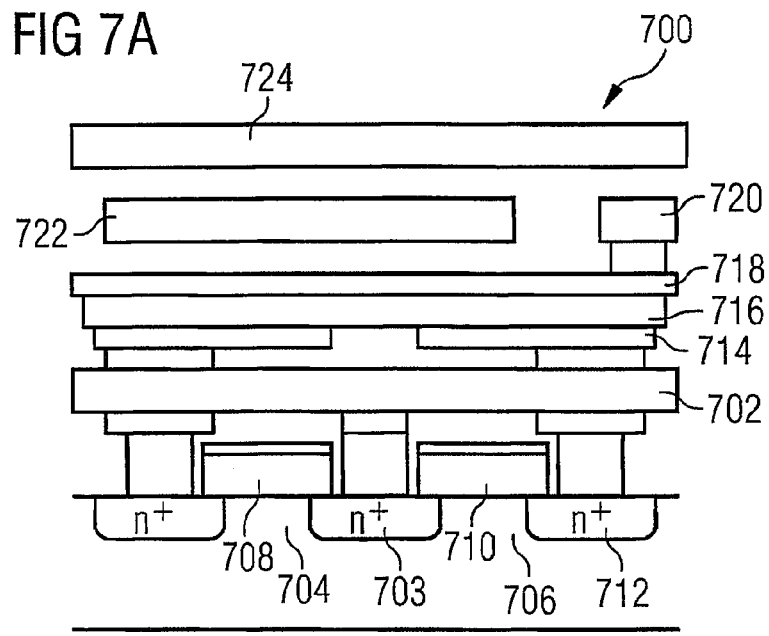
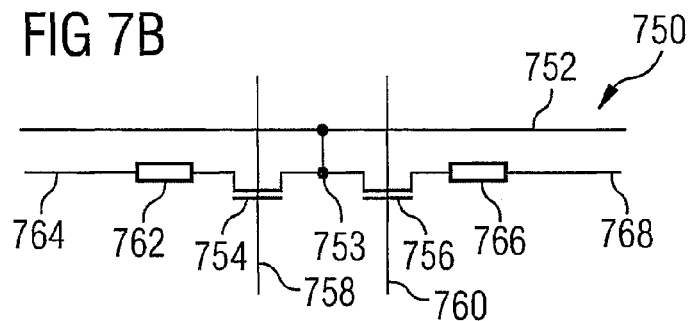
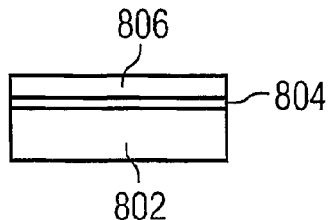
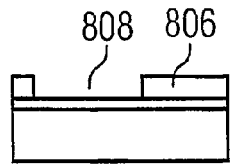
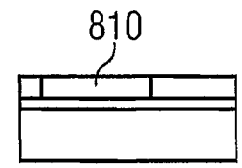
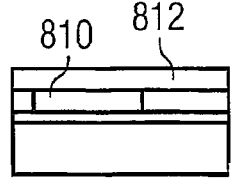
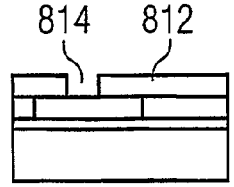
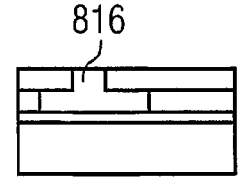

INCREASED SWITCHING CYCLE RESISTIVE MEMORY ELEMENT

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 1A and 1B show a resistive memory element in which a conductive filament is formed through a transition metal oxide layer;

FIGS. 2A and 2B show alternative block diagram layouts of a memory cell using a resistive memory element;

FIGS. 5A and 5B show stages in the fabrication of a resistive memory element in accordance with an embodiment of the invention;

FIG. 6 shows a cross section of a memory device in accordance with an embodiment of the invention;

FIGS. 7A and 7B show, respectively, an integration scheme for a memory device in accordance with an embodiment of the invention, and a schematic representation of two memory cells configured as shown in the integration scheme;

FIGS. 8A-8F show steps in the formation of a bottom contact that may be used with a resistive memory element in accordance with an embodiment of the invention;

DETAILED DESCRIPTION OF ILLUSTRATIVE EMBODIMENTS

Figure 3:
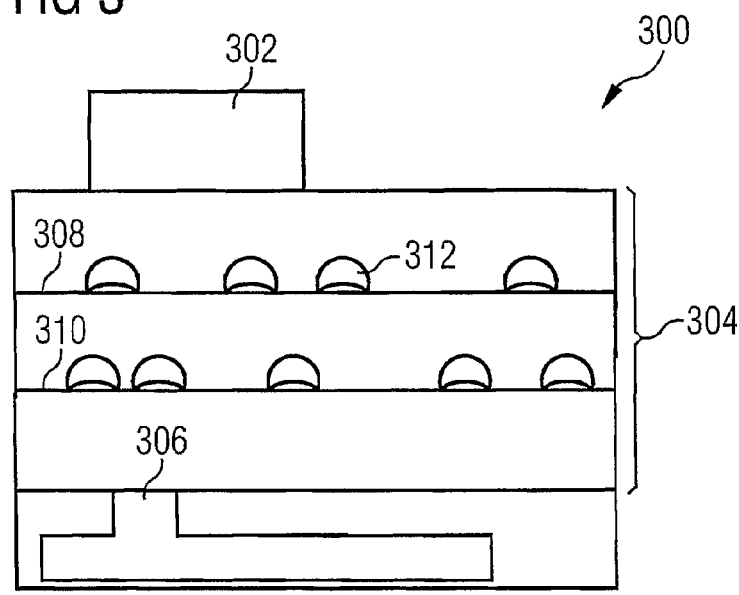
FIG. 3 shows a resistive memory element including metal-rich defects in the switching layer, in accordance with an embodiment of the invention.

Non-volatile memory retains its stored data even when power is not present. This type of memory is used in a wide variety of electronic equipment, including digital cameras, portable audio players, wireless communication devices, personal digital assistants, and peripheral devices, as well as for storing firmware in computers and other devices.

Non-volatile memory technologies include flash memory, magnetoresistive random access memory (MRAM), phase change random access memory (PCRAM), conductive bridging random access memory (CBRAM), and various other resistive memory technologies. Due to the great demand for non-volatile memory devices, researchers are continually improving non-volatile memory technology, and developing new types of non-volatile memory.

The scale of electronic devices is constantly being reduced. For memory devices, conventional technologies, such as flash memory and DRAM, which store information based on storage of electric charges, may reach their scaling limits in the foreseeable future. Additional characteristics of these technologies, such as the high switching voltages and limited number of read and write cycles of flash memory, or the limited duration of the storage of the charge state in DRAM, pose additional challenges. To address some of these issues, researchers are investigating memory technologies that do not use storage of an electrical charge to store information. One such technology is a resistive memory based on the bistable resistance change in transition metal oxide layers. As will be described below, in certain transition metal oxide materials, in response to the application of an adequate voltage, a conductive path or filament may be formed or removed within the material, due to thermal electronic exchange effects. The formation and removal of this conductive filament is coupled with a thermistor effect, which induces the bistable switching process, due to the inhomogeneous temperature distribution in the transition metal oxide material in response to the application of a voltage.

FIG. 1A shows a resistive memory element 100 of this type. The resistive memory element 100 includes a top contact 102, a bottom contact 104, and a transition metal oxide layer 106 located between the top contact 102 and the bottom contact 104. The transition metal oxide layer 106 may include any of a number of transition metal compounds, such as NiO, $TiO_2$, $HfO_2$, $ZrO_2$, $Nb_2O_5$, $Ta_2O_5$, or other suitable materials.

When a voltage above a "SET" voltage is applied across the transition metal oxide layer 106, a conductive filament 114 is formed, placing the transition metal oxide layer in an "ON" state, dramatically reducing the resistance of the transition metal oxide layer 106. For example, a SET voltage of approximately 2V applied across an NiO film with a thickness between approximately 20 nm and approximately 100 nm may cause the resistance of the film to drop from approximately 1 KΩ to 10 KΩ (depending on the thickness of the layer) to less than approximately 100 Ω.

As shown in FIG. 1B, when a "RESET" voltage is applied across the transition metal oxide layer 106 in the "ON" state, the conductive filament 114 is removed, returning the transition metal oxide layer 106 to an "OFF" state, and increasing the resistance of the transition metal oxide layer 106. The "RESET" voltage for use with a transition metal oxide layer including an NiO film may be approximately 1V.

To determine the current memory state of the resistive memory element 100, a sensing current may be routed through the resistive memory element 100. The sensing current encounters a high resistance if no filament 114 exists within the resistive memory element 100, and a low resistance when a filament 114 is present. A high resistance may, for example, represent "0", while a low resistance represents "1", or vice versa.

FIG. 2A shows an illustrative memory cell that uses a resistive memory element. The memory cell 200 includes a select transistor 202 and a resistive memory element 204. The select transistor 202 includes a first source/drain 206 that is connected to a bit line 208, a second source/drain 210 that is connected to the memory element 204, and a gate 212 that is connected to a word line 214. The resistive memory element 204 is also connected to a common line 216, which may be connected to ground, or to other circuitry, such as circuitry (not shown) for determining the resistance of the memory cell 200, for use in reading. Alternatively, in some configurations, circuitry (not shown) for determining the state of the memory cell 200 during reading may be connected to the bit line 208. It should be noted that as used herein the terms connected and coupled are intended to include both direct and indirect connection and coupling, respectively.

To write to the memory cell, the word line 214 is used to select the cell 200, and a voltage on the bit line 208 is applied through the resistive memory element 204, to form or remove a conductive path or filament in the resistive memory element 204, changing the resistance of the resistive memory element 204. Similarly, when reading the cell 200, the word line 214 is used to select the cell 200, and the bit line 208 is used to apply a reading voltage across the resistive memory element 204 to measure the resistance of the resistive memory element 204.

The memory cell 200 may be referred to as a 1T1J cell, because it uses one transistor, and one memory junction (the resistive memory element 204). Typically, a memory device will include an array of many such cells. It will be understood that other configurations for a 1T1J memory cell, or configurations other than a 1T1J configuration may be used with a resistive memory element. For example, in FIG. 2B, an alternative arrangement for a 1T1J memory cell 250 is shown, in which a select transistor 252 and a resistive memory element 254 have been repositioned with respect to the configuration shown in FIG. 2A.

In the alternative configuration shown in FIG. 2B, the resistive memory element 254 is connected to a bit line 258, and to a first source/drain 256 of the select transistor 252. A second source/drain 260 of the select transistor 252 is connected to a common line 266, which may be connected to ground, or to other circuitry (not shown), as discussed above. A gate 262 of the select transistor 252 is controlled by a word line 264.

One challenge in producing resistive memories based on bistable switching in NiO and other transition metal oxides (TMOs) is the limited endurance of many such memories. The high initial resistance of TMOs at room temperature and the high current density in the small filaments that are formed, as well as the high thermal budget during the voltage pulses that are used to program these memories may lead to a limited number of switching cycles and variation in switching parameters (e.g., the voltages needed for switching). For example, in some devices based on NiO, the device may stop switching properly after as few as $10^6$ switching cycles.

In accordance with an embodiment of the invention, a resistive TMO-based memory element with greater endurance and lower voltage needed for the formation of a conductive path or filament through the TMO material may be provided by generating impurities or defects in the TMO material. These defects, which may take the form of metal-rich "nano-dots" are scattered throughout the TMO material, but do not fully penetrate through the TMO material. In some embodiments, the defects may be formed in selected layers within the TMO material, to provide an appropriate density of such metal-rich impurities. In accordance with an embodiment of the invention, the presence of these defects in the TMO material decreases the current density during programming to a level below a critical density, at which chemical conversion or destruction begins. As a result of introducing these defects, the formation voltage for a conductive filament is reduced, and the number of switching cycles (i.e., the endurance) of the memory element is increased.

FIG. 3 shows an example embodiment of a resistive memory element 300 in accordance with an embodiment of the invention. The resistive memory element 300 includes a top contact 302, a switching layer 304, and a bottom contact 306. The switching layer 304 includes a TMO material, such as NiO, $TiO_2$, $HfO_2$, $ZrO_2$, $Nb_2O_5$, $Ta_2O_5$, or other suitable materials. Many such materials exhibit a bistable resistance change.

The switching layer 304 includes sub-layers 308 and 310, on which numerous "nano-dot" defects 312 have intentionally been formed. The nano-dot defects 312 may include clusters of metal-rich materials or other impurities that have been intentionally introduced into the switching layer 304. These "nano-dot" defects 312 provide impurities within the switching layer 304, reducing the formation voltage of a conductive path or filament, and increasing the number of switching cycles (i.e., the endurance) of the memory element 300, in accordance with an embodiment of the invention.

As explained above, when a "SET" voltage is applied across the switching layer 304, a conductive path or filament forms, placing the resistive memory element 300 in a low resistance state. When a "RESET" voltage is applied, the conductive path or filament is removed, placing the resistive memory element 300 in a high resistance state. The resistivity of the resistive memory element 300 determines the value stored. For example, the high resistance state may represent a "0" and the low resistance state may represent a "1", or vice versa. In some embodiments, multiple intermediate resistance states may be used to store more than one bit of information in such a resistive memory element.

It will be understood that although only two sub-layers 308 and 310 having nano-dot defects 312 are shown in the switching layer 304, numerous such sub-layers with nano-dots or other metal-rich defects may be used. Additionally, although the nano-dot defects 312 are disposed in regular sub-layers 308 and 310 in the switching layer 304, it will be understood that in other embodiments, other arrangements of such impurities may be used. For example, the nano-dot defects may be randomly scattered throughout the switching layer 304. Any arrangement of the nano-dot defects in a manner that does not fully penetrate through the switching layer can be used in accordance with the principles of an embodiment of the invention.

Figure 4:
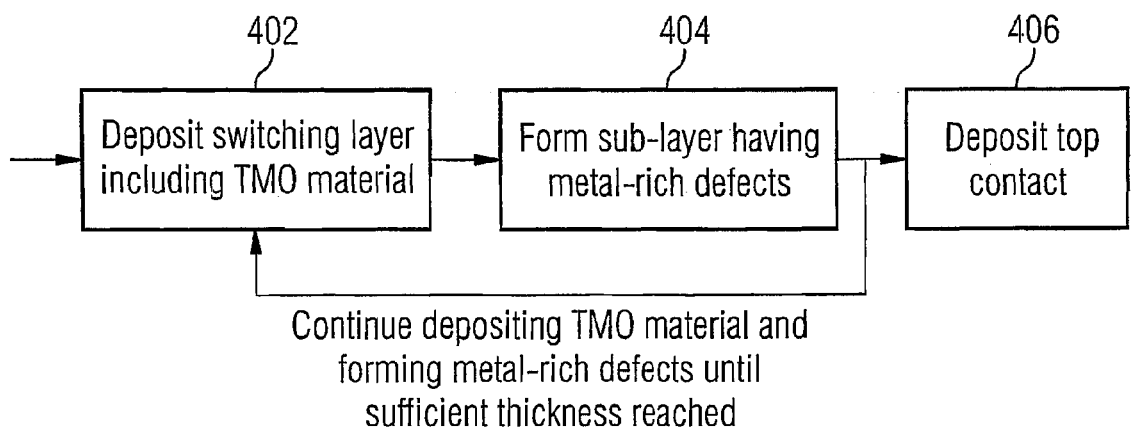
FIG. 4 is a block diagram of a method for fabricating a resistive memory element in accordance with an embodiment of the invention.

Referring now to FIG. 4, an example of a method of manufacturing an integrated circuit including resistive memory element in accordance with an embodiment of the invention is described. The method results in the introduction of metal-rich defects, or "nano-dots" in a TMO switching layer, using an energetically "gentle" process. As explained above, the use of such metal-rich defects results in a reduced formation voltage for a conductive path or filament, and a greater number of switching cycles.

As described, the method starts with conventionally pre-cleaned silicon wafers. Depending on the integration scheme, as described below, the wafers may already include select transistors, vias, an isolation layer, a bottom electrode, and/or other components used in the formation of memory devices. These components may be deposited on the wafer using conventional CMOS technology, or any other technology or methods now known or later developed. Thus, the method described with reference to FIG. 4 shows only the manufacture of the switching layer including metal-rich defects or impurities, and deposition of the top contact. The example method described with reference to FIG. 4 is compatible with a conventional CMOS process.

In step 402, a switching layer material including a transition metal oxide compound is deposited. This may be accomplished, for example, using mid-frequency (MF) reactive sputtering of metal targets with a plasma excitation frequency or power supply frequency in the range of 1 to 10 KHz in an argon/oxygen mixture working gas. Depending on the desired composition of the TMO compound being deposited, the metal target may include metals such as Ni, Ti, Hf, Zr, Nb, Ta, or other suitable metals.

In step 404, deposition of the metal oxide compound is temporarily stopped, and a sub-layer having metal-rich defects is deposited. This can be done by inducing electrical arcing by switching the sputtering from MF to DC (or by reducing the frequency) and by switching the working gas to pure oxygen. This causes the deposition of oxygen molecules or atoms on a surface of the target, forming a thin isolation layer. After a short time this isolation layer is broken by discharge hits (arcing). This electrical arcing causes randomly distributed "defects" or impurities to be formed due to clusters of surface metal atoms being de-sputtered and deposited on the wafer as "lens-shaped" metal-rich clusters. During this step, little or no real layer growth occurs. Instead, inhomogeneously distributed metal-rich clusters are deposited on the surface of the TMO switching layer material. After approximately 10 to 15 seconds of sputter time, the working gas is switched back to the argon/oxygen mixture, and the sputter regime is switched back from DC to MF, causing deposition of the TMO switching layer material to continue, as described in step 402.

Alternating between deposition of the TMO switching layer material in step 402 and deposition of metal-rich clusters in step 404 may occur several times during deposition of the switching layer. For example, for a total switching layer thickness of 40 nm, there may be three sub-layers containing metal-rich defects in some embodiments.

Once the switching layer has reached a sufficient thickness by alternating between depositing the TMO material and depositing metal-rich clusters, in step 406, a top contact is deposited. The top contact may include metals such as Ti or Pt, and may be deposited by means of sputtering. After the top contact has been deposited, the memory device may be completed using conventional techniques.

This method is further illustrated in FIGS. 5A and 5B. In FIG. 5A, MF sputtering with a metal target 502 is used in an argon/oxygen working gas 504 to deposit a TMO material 506 on a wafer 508.

As shown in FIG. 5B, periodically, the system switches to DC sputtering with the metal target 502, in a pure oxygen working gas 520. This causes the formation of a thin isolation layer 522 on the target 502. This causes arcing 524, which causes metal-rich clusters 526 to be deposited on a surface of the TMO material 506 on the wafer 508.

Referring to FIG. 6, a cross section of two memory cells of a completed integrated circuit resistive memory device in accordance with an embodiment of the invention is shown. While the cross section provides an integration scheme that would be suitable for use with an integrated circuit according to an embodiment of the present invention, it may also be used for conventional resistive memory devices. Similarly, a resistive memory element according to an embodiment of the invention is not limited to use in a device such as is shown in FIG. 6, but may be used in any TMO-based resistive memory device.

As can be seen, the memory device 600 includes word lines 602 and 604, which connect to the gates of select transistors 606 and 608. A shared drain 610 of select transistors 606 and 608 is connected to a common line 612, which may be connected to ground. The source region 614 of select transistor 606 and the source region 616 of select transistor 608 are connected to resistive memory elements 618 and 620, respectively. Each of the resistive memory elements 618 and 620 has a bottom electrode, a Switching layer which contains metal-rich defects in accordance with the invention, and a top electrode. The resistive memory elements 618 and 620 are connected to a bit line 622.

Referring to FIG. 7A, a cross section view of an alternative integration scheme for an integrated circuit including two cells of a resistive memory device 700 is shown. As with the resistive memory device shown in FIG. 6, it will be understood that although this integration scheme would be suitable for use with a resistive memory device according to an embodiment of the present invention, it may also be used for conventional resistive memory devices, and a resistive memory element according to an embodiment of the invention is not limited to use in a device such as is shown in FIG. 7A.

In the resistive memory device 700 shown in FIG. 7A, a bit line 702 is connected to a common source for the select transistors 704 and 706 of two memory cells. The gates of the transistors 704 and 706 are controlled by word lines 708 and 710, respectively. Examining just one of the cells (the other is substantially identical), the drain 712 of the select transistor 706 is connected to a bottom contact 714, which contacts a Switching layer 716 that includes metal-rich "nano-dot" defects, in accordance with the invention. A top contact 718 is located above the Switching layer 716, and is connected to a common line 720. The same metal layer that includes the connection to the common line 720 may also include other connections, such as a segmented word line connection 722. A top metal layer 724 may carry power for the device, or be used for other purposes on an integrated device.

In a device having a layout as shown in the cross section 700, the word line pitch and the bit line pitch may be equal, and may be approximately twice the feature size. Using a technology that provides a feature size of 90 nm, this means that the bit line and word line pitch would be approximately 180 nm.

In FIG. 7B, a schematic for the memory cells shown in FIG. 7A is shown. In the resistive memory device 750, a bit line 752 is connected to a common source for transistors 754 and 756. Word lines 758 and 760 control gates of transistors 754 and 756, respectively. The transistor 754 is connected to a resistive memory element 762, and to a common line 764, while the transistor 756 is connected to a resistive memory element 766, and to a common line 768 (which may be the same as the common line 764). The resistive memory elements 762 and 766 include a Switching layer having defects to decrease the formation voltage for filaments, and increase the endurance of the memory device, in accordance with the invention.

Referring to FIGS. 8A-8F, example steps in a process for constructing a bottom contact for use with a resistive memory element are described. It will be understood that this process, and the bottom contact that is created using it, may be used with a conventional resistive memory element, as well as a resistive memory element according to an embodiment of the invention. It will further be recognized that a resistive memory element according to an embodiment of the invention is not limited to using a bottom contact constructed by such a process, but may use any suitable bottom contact, constructed by any process now known or later developed.

FIG. 8A shows an oxide layer 802 onto which a nitride etch stop 804 has been deposited, as well as an additional oxide layer 806. As shown in FIG. 8B, a lithographic process and etching is used to create a trench 808 in the oxide layer 806 for the bottom contact.

FIG. 8C shows a conductive material 810, such as tungsten (W), deposited in the trench 808, and planarized, for example, by a chemical mechanical planarization process.

In FIG. 8D, a nitride/oxide layer 812 has been deposited over the conductive material 810. As shown in FIG. 8E, a lithographic process and etching are used to form a hole 814 in the nitride/oxide layer 812.

Next, as shown in FIG. 8F, the hole 814 is filled with TiN/W or another suitable material, and planarized, completing construction of a bottom contact 816. Once the bottom contact has been deposited, a method such as is described above with reference to FIG. 4 may be used to construct a resistive memory element above the bottom contact, in accordance with an embodiment of the invention.

Figure 9:
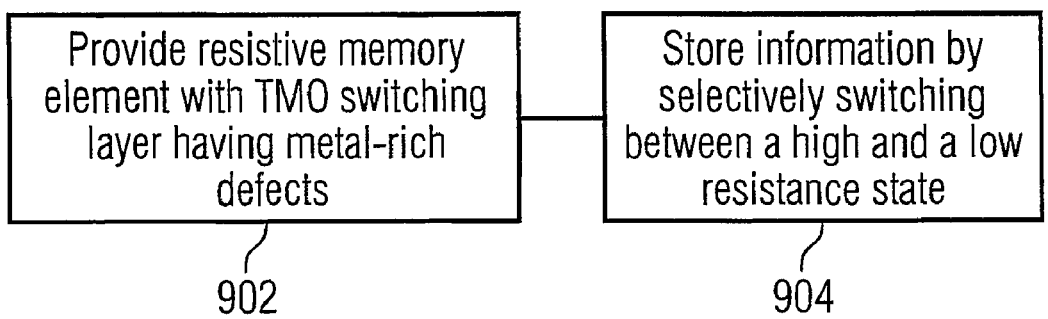
FIG. 9 is a block diagram of a method of storing information in accordance with an embodiment of the invention.

Referring now to FIG. 9, a method of storing information in accordance with an embodiment of the present invention is described. In step 902, a resistive memory element including a TMO switching layer having metal-rich defects in accordance with an embodiment of the invention is provided. As discussed above, the introduction of such defects in the TMO switching layer will reduce the formation voltage for conductive filaments and increase the endurance of the resistive memory element.

In step 904, information is stored in the resistive memory element by selectively switching between a high resistance state and a low resistance state by reversibly forming a conductive filament in the TMO switching layer.

Figure 10A:
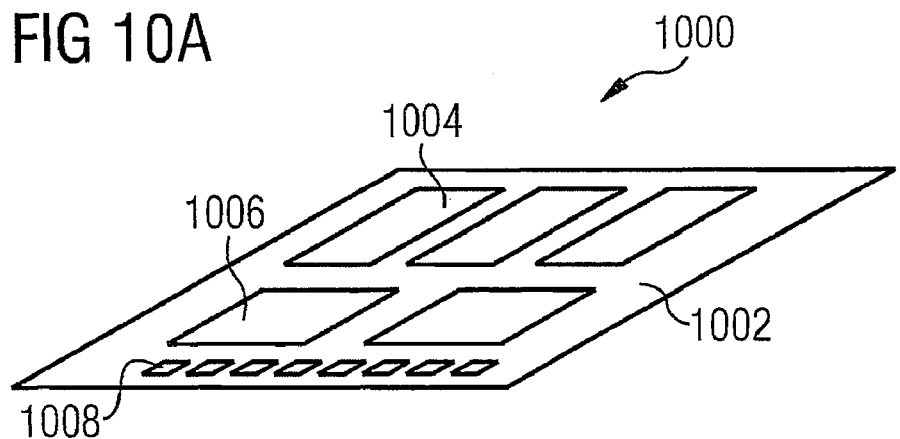
FIGS. 10A and 10B show a memory module and a stackable memory module, respectively, which may use memory elements in accordance with an embodiment of the invention.
Figure 10B:
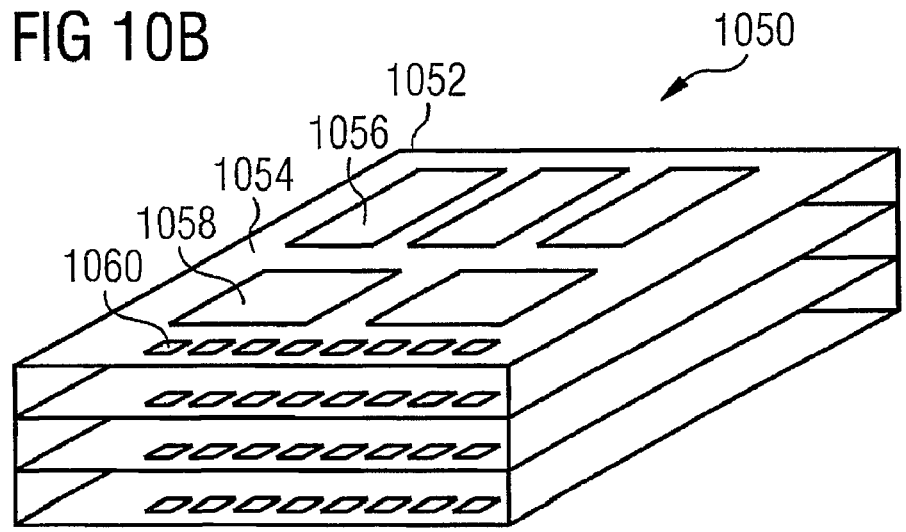

Memory cells including memory elements such as are described above may be used in memory devices that contain large numbers of such cells. These cells may, for example, be organized into an array of memory cells having numerous rows and columns of cells, each of which stores one or more bits of information. Memory devices of this sort may be used in a variety of applications or systems. As shown in FIGS. 10A and 10B, in some embodiments, memory devices such as those described herein may be used in modules. In FIG. 10A, a memory module 1000 is shown, on which one or more memory devices 1004 are arranged on a substrate 1002. Each memory device 1004 may include numerous memory cells in accordance with an embodiment of the invention. The memory module 1000 may also include one or more electronic devices 1006, which may include memory, processing circuitry, control circuitry, addressing circuitry, bus interconnection circuitry, or other circuitry or electronic devices that may be combined on a module with a memory device 1004. Additionally, the memory module 1000 includes multiple electrical connections 1008, which may be used to connect the memory module 1000 to other electronic components, including other modules. For example, the module 1000 may be plugged into a larger circuit board, including PC main boards, video adapters, cell phone circuit boards or portable video or audio players, among others.

As shown in FIG. 10B, in some embodiments, these modules may be stackable, to form a stack 1050. For example, a stackable memory module 1052 may contain one or more memory devices 1056, arranged on a stackable substrate 1054. Each of the memory devices 1056 contains memory cells that employ memory elements in accordance with an embodiment of the invention. The stackable memory module 1052 may also include one or more electronic devices 1058, which may include memory, processing circuitry, control circuitry, addressing circuitry, bus interconnection circuitry, or other circuitry or electronic devices that may be combined on a module with a memory device 1056. Electrical connections 1060 are used to connect the stackable memory module 1052 with other modules in the stack 1050, or with other electronic devices. Other modules in the stack 1050 may include additional stackable memory modules, similar to the stackable memory module 1052 described above, or other types of stackable modules, such as stackable processing modules, control modules, communication modules, or other modules containing electronic components.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising:
   a resistive transition metal oxide based memory element comprising a top contact and a bottom contact;
   a switching layer disposed between the top contact and the bottom contact, the switching layer selectively switching between a low resistance state and a high resistance state; and
   a plurality of intentionally formed defects disposed within the switching layer such that a current density needed to program the integrated circuit remains below a critical density at which chemical conversion or destruction begins.

2. The integrated circuit of claim 1, wherein the switching layer comprises a bistable switching material.

3. The integrated circuit of claim 1, wherein the switching layer comprises a transition metal oxide material.

4. The integrated circuit of claim 3, wherein the transition metal oxide material comprises $NiO$, $TiO_2$, $HfO_2$, $ZrO_2$, $Nb_2O_5$, or $Ta_2O_5$.

5. The integrated circuit of claim 1, wherein the intentionally formed defects comprise metal-rich clusters.

6. The integrated circuit of claim 1, wherein the intentionally formed defects are arranged in one or more sub-layers within the switching layer.

7. The integrated circuit of claim 1, wherein the switching layer switches between the high resistance state and the low resistance state by forming a conductive filament within the switching layer.

8. The integrated circuit of claim 7, wherein the conductive filament is formed within the switching layer when a formation voltage is applied between the top contact and the bottom contact.

9. The integrated circuit of claim 7, wherein the intentionally formed defects further reduce a formation voltage of the conductive filament.

10. An integrated circuit comprising:
    a memory cell comprising a select transistor; and
    a resistive transition metal oxide based memory element coupled to the select transistor, the resistive transition metal oxide based memory element comprising a top contact, a bottom contact, and a switching layer,
    wherein the switching layer is disposed between the top contact and the bottom contact, and comprises a plurality of intentionally formed defects disposed within the switching layer to reduce the current density needed to program the memory element to a level below a critical density at which chemical conversion or destruction begins; and
    wherein information is stored by selectively switching between a low resistance state and a high resistance state.

11. The integrated circuit of claim 10, wherein the switching layer comprises a transition metal oxide material.

12. The integrated circuit of claim 10, wherein the intentionally formed defects comprise metal-rich clusters.

13. The integrated circuit of claim 10, wherein the intentionally formed defects are arranged in one or more sub-layers within the switching layer.

14. The integrated circuit of claim 10, wherein the switching layer switches between the high resistance state and the low resistance state by forming a conductive filament within the switching layer.

15. The integrated circuit of claim 14, wherein the intentionally formed defects further reduce a formation voltage of the conductive filament.

16. A method for storing information, comprising:
providing a resistive transition metal oxide based memory element comprising a top contact, a bottom contact, and a switching layer, wherein the switching layer is disposed between the top contact and the bottom contact, and comprises a plurality of intentionally formed defects disposed within the switching layer to increase a number of switching cycles of the resistive transition metal oxide based memory element; and
programming the resistive transition metal oxide based memory element to store information by switching the memory element between a low resistance state and a high resistance state, wherein a current density needed to perform the programming is lower than a critical density at which chemical conversion or destruction begins.

17. The method of claim 16, wherein providing the resistive transition metal oxide based memory element comprises providing the switching layer comprising a transition metal oxide.

18. The method of claim 16, wherein providing the resistive transition metal oxide based memory element comprises providing the switching layer wherein the intentionally formed defects comprise metal-rich clusters.

19. The method of claim 16, wherein providing the resistive transition metal oxide based memory element comprises providing the switching layer wherein the intentionally formed defects are arranged in one or more sub-layers within the switching layer.

20. The method of claim 16, wherein selectively switching the resistive transition metal oxide based memory element between a low resistance state and a high resistance state comprises forming a conductive filament within the switching layer.

21. A memory module comprising:
a plurality of integrated circuits, wherein the integrated circuits comprise a resistive transition metal oxide based memory element comprising a top contact, a bottom contact, and a switching layer, wherein the switching layer is disposed between the top contact and the bottom contact, and comprises a plurality of intentionally formed defects disposed within the switching layer such that a current density needed to program the memory element is decreased below a critical density at which chemical conversion or destruction begins.

22. The memory module of claim 21, wherein the switching layer comprises a transition metal oxide.

23. The memory module of claim 21, wherein the intentionally formed defects comprise metal-rich clusters.

24. The memory module of claim 21, wherein the intentionally formed defects are arranged in one or more sub-layers within the switching layer.

25. The memory module of claim 21, wherein the switching layer switches between a high resistance state and a low resistance state by forming a conductive filament within the switching layer.

26. The memory module of claim 25, wherein the intentionally formed defects further reduce a formation voltage of the conductive filament.

27. The memory module of claim 21, wherein the memory module is stackable.

* * * * *